United States Patent
Kranz et al.

(10) Patent No.: US 10,122,324 B2
(45) Date of Patent: Nov. 6, 2018

(54) MULTI-PHASE AMPLIFIER CIRCUITS AND METHODS FOR GENERATING AN AMPLIFIED OUTPUT SIGNAL

(71) Applicant: Intel IP Corporation, Santa Clara, CA (US)

(72) Inventors: Christian Kranz, Ratingen (DE); Stephan Henzler, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/353,775

(22) Filed: Nov. 17, 2016

(65) Prior Publication Data

US 2017/0179890 A1    Jun. 22, 2017

(30) Foreign Application Priority Data

Dec. 21, 2015  (DE) .......................... 10 2015 122 406

(51) Int. Cl.
| | |
|---|---|
| *H03F 3/38* | (2006.01) |
| *H03F 1/08* | (2006.01) |
| *H03F 3/19* | (2006.01) |
| *H03F 3/217* | (2006.01) |

(52) U.S. Cl.
CPC .............. *H03F 1/08* (2013.01); *H03F 3/19* (2013.01); *H03F 3/217* (2013.01); *H03F 2200/102* (2013.01); *H03F 2200/451* (2013.01)

(58) Field of Classification Search
CPC ............... H03F 1/08; H03F 3/19; H03F 3/217
USPC ........................................ 330/10, 251, 207 A
See application file for complete search history.

(56) References Cited

U.S. PATENT DOCUMENTS 6,788,137 B2 *   9/2004  Morita .................. H03F 3/2171
                                                          330/10

* cited by examiner

*Primary Examiner* — Khanh V Nguyen
*Assistant Examiner* — Khiem Nguyen
(74) *Attorney, Agent, or Firm* — Eschweiler & Potashnik, LLC

(57) ABSTRACT

A multi-phase amplifier circuit includes an amplification circuit configured to generate a plurality of phase signals and to provide the plurality of phase signals to a plurality of inductors. An inductive coupling between a first pair of inductors differs from an inductive coupling between a second pair of inductors by a first coupling difference. The amplification circuit is configured to provide two phase signals comprising a first phase difference of less than 180° to the first pair of inductors and two further phase signals comprising the first phase difference to the second pair of inductors. An inductive coupling between a third pair of inductors differs from an inductive coupling between a fourth pair of inductors by a second coupling difference. The amplification circuit is configured to provide two phase signals comprising a second phase difference of 180° to the third pair of inductors and two further phase signals comprising the second phase difference to the fourth pair of inductors.

20 Claims, 12 Drawing Sheets

FIG. 9
FIG. 10a
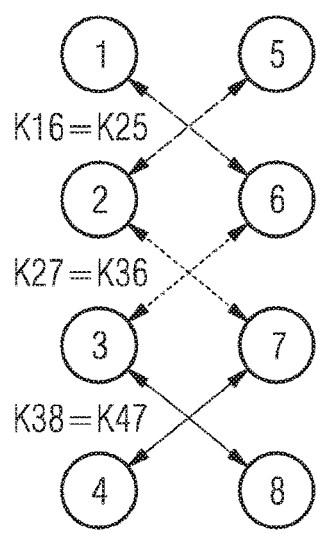
FIG. 10b
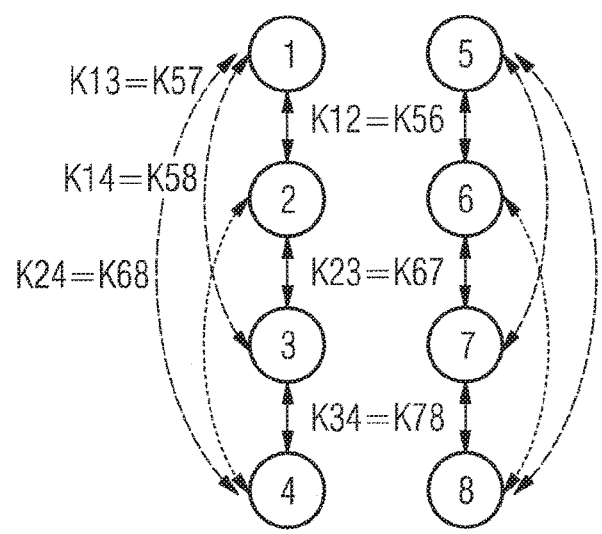

MULTI-PHASE AMPLIFIER CIRCUITS AND METHODS FOR GENERATING AN AMPLIFIED OUTPUT SIGNAL

CROSS REFERENCE TO RELATED APPLICATIONS

This application claims priority to German Application No. 10 2015 122 406.2, filed on Dec. 21, 2015, which is hereby incorporated herein by reference in its entirety.

FIELD

The present disclosure relates to the amplification of signals and in particular to multi-phase amplifier circuits and methods for generating an amplified output signal.

BACKGROUND

Multi-phase amplifier outputs often include switching spurs generated at multiples of the switching frequencies, the switching spurs occurring due to unavoidable mismatch between the different phases of the amplifier. In addition to phase mismatch, another root cause for switching spurs is inductive coupling (inductor coupling). For example, magnetically shielding the inductors or placing the inductors at large distances to one another may reduce the inductive coupling. However, cost and space requirements for the size involved with using magnetically shielded inductors are high. Additional large PCB (printed circuit board) sizes for achieving the large distances may be necessary, such large PCB sizes not being an option for small form-factor devices. Furthermore, large distances are technically critical because high speed signals cannot be easily routed over such distances.

BRIEF DESCRIPTION OF THE DRAWINGS

Some examples of apparatuses and/or methods will be described in the following by way of example only, and with reference to the accompanying figures, in which

FIG. 9 shows phase pairs in an 8-channel system of an 8-phase amplifier circuit;

FIG. 10a shows a possible cross coupling between phase pairs of an 8-phase amplifier circuit;

FIG. 10b shows further possible cross coupling between phase pairs of an 8-phase amplifier circuit;

DETAILED DESCRIPTION

Figure 1:
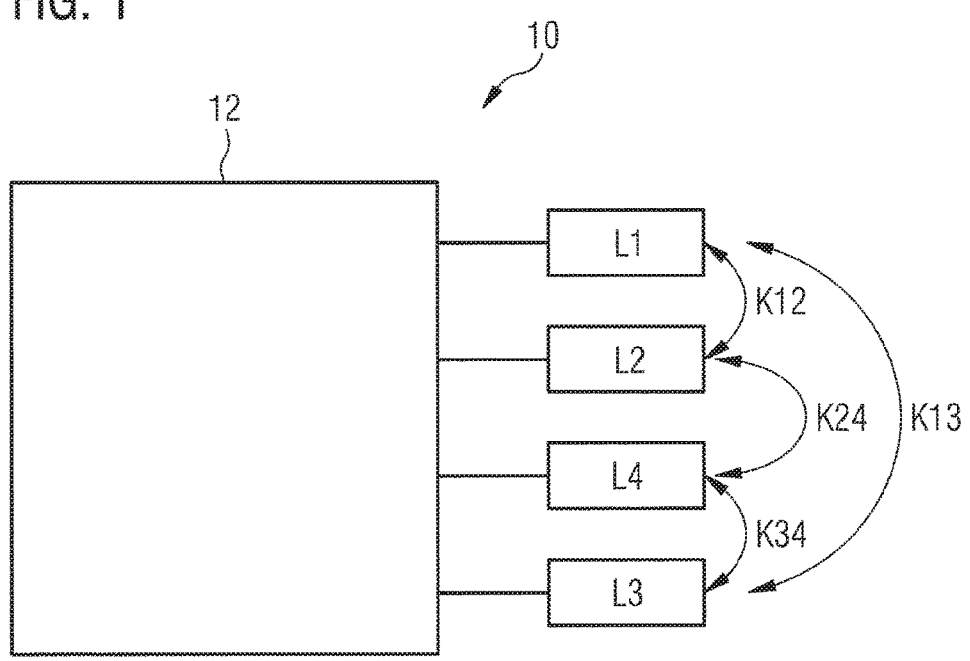
FIG. 1 shows a schematic illustration of a multi-phase amplifier circuit.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or component signals, but do not preclude the presence or addition of one or more other features, integers, steps, operations, elements, component signals and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Digital and/or analog signals may be amplified in various ways. One possibility is the usage of a class D amplifier or switching amplifier and in particular a multi-phase amplifier (e.g. multi-phase digital switching amplifier).

An ideal multi-phase digital amplifier may create switching spurs at k*n-times the single phase switching frequency for an n-phase configuration (k=1, 2 . . . ). In an ideal amplifier no spur may be generated at other multiple of the switching frequency fs. For example, in an ideal 4-phase converter switching spurs may be only generated at 4×fs, 8×fs . . . but not at 1×fs, 2×fs or 3×fs.

Due to unavoidable mismatch between the different phases, spurs may be generated at other multiples of the switching frequency also.

In addition to phase mismatch, the inductive coupling (called inductor coupling) is another root cause for spurs in multi-phase digital amplifiers, for example. In electrical engineering, two inductors are referred to as mutual-inductively coupled or magnetically coupled when the inductors are configured such that a change in current through one wire induces a voltage across the ends of the other wire through electromagnetic induction.

The one-times switching frequency (1×fs) may be critical because it is closest to the bandwidth of the amplifier and cannot be filtered that much by the output filter as the higher frequencies, for example.

In the following, values for phases of signals and/or phase differences between signals are mentioned, which may indicate ideal or desired values, although these values may be difficult to be implemented or cannot be implemented exactly due to unavoidable manufacturing tolerances and/or matching tolerances.

Figure 5:
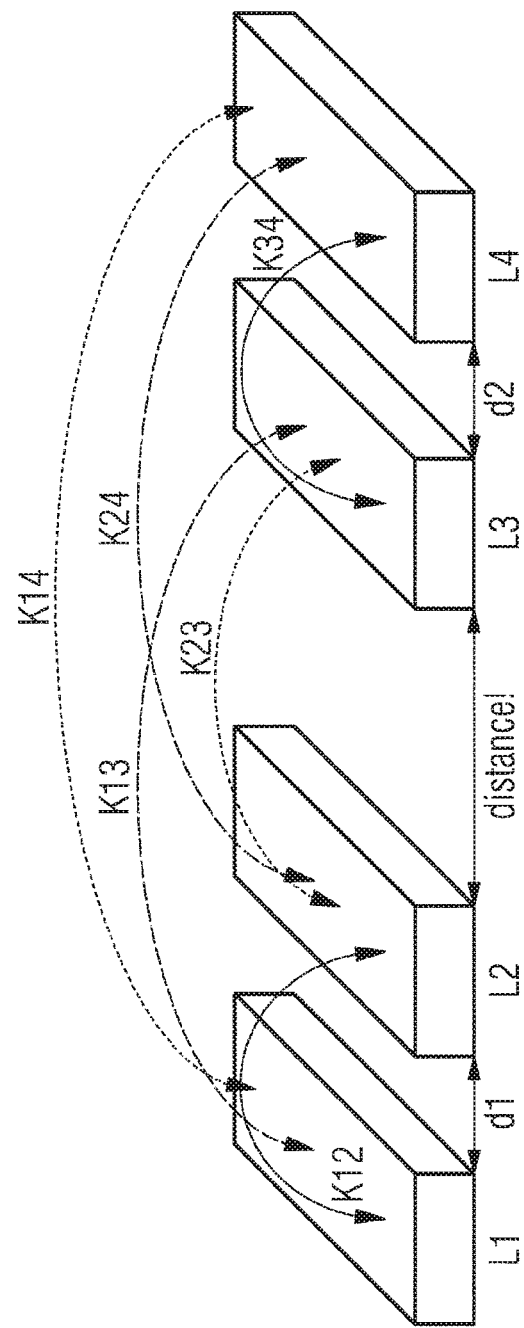
FIG. 5 shows a schematic illustration of another arrangement of inductors of a 4-phase amplifier circuit.

FIG. 5 shows a phase ordering and cross coupling arrangement of a plurality of inductors, which generates a 1×fs spur. In the 4-phase case, the phases are separated by 90° phase each. For example, phase 1 is the reference phase (0 degree phase shift), phase 2 has 90 degree phase shift to phase 1, phase 3 has 180 degree phase shift to phase 1 and phase 4 has 270 degree phase shift to phase 1. FIG. 5 shows the coupling between the four output inductors of the four phases. Kxy is the coupling between phase x and y.

In this constellation phase 1 and phase 3 may build a first phase pair and phase 2 and phase 4 may build a second phase pair with respect to the one times switching frequency spur (1×fs). A coupling between the four output inductors of the four phases is shown.

FIG. 5 shows an arrangement of four inductors (L1-L4). First and second inductors L1, L2 along with third and fourth inductors L3, L4 are separated by a first distance d1, d2 while second inductor L2 and third inductor L3 are separated by much larger distance. The inductors are arranged such that certain couplings occur between pairs of inductors. For example, the much larger distance between second and third inductors, along with the certain couplings, facilitate a reduction in the one-time switching spur at the expense of PCB/Package space and costs, as discussed above.

Figure 6:
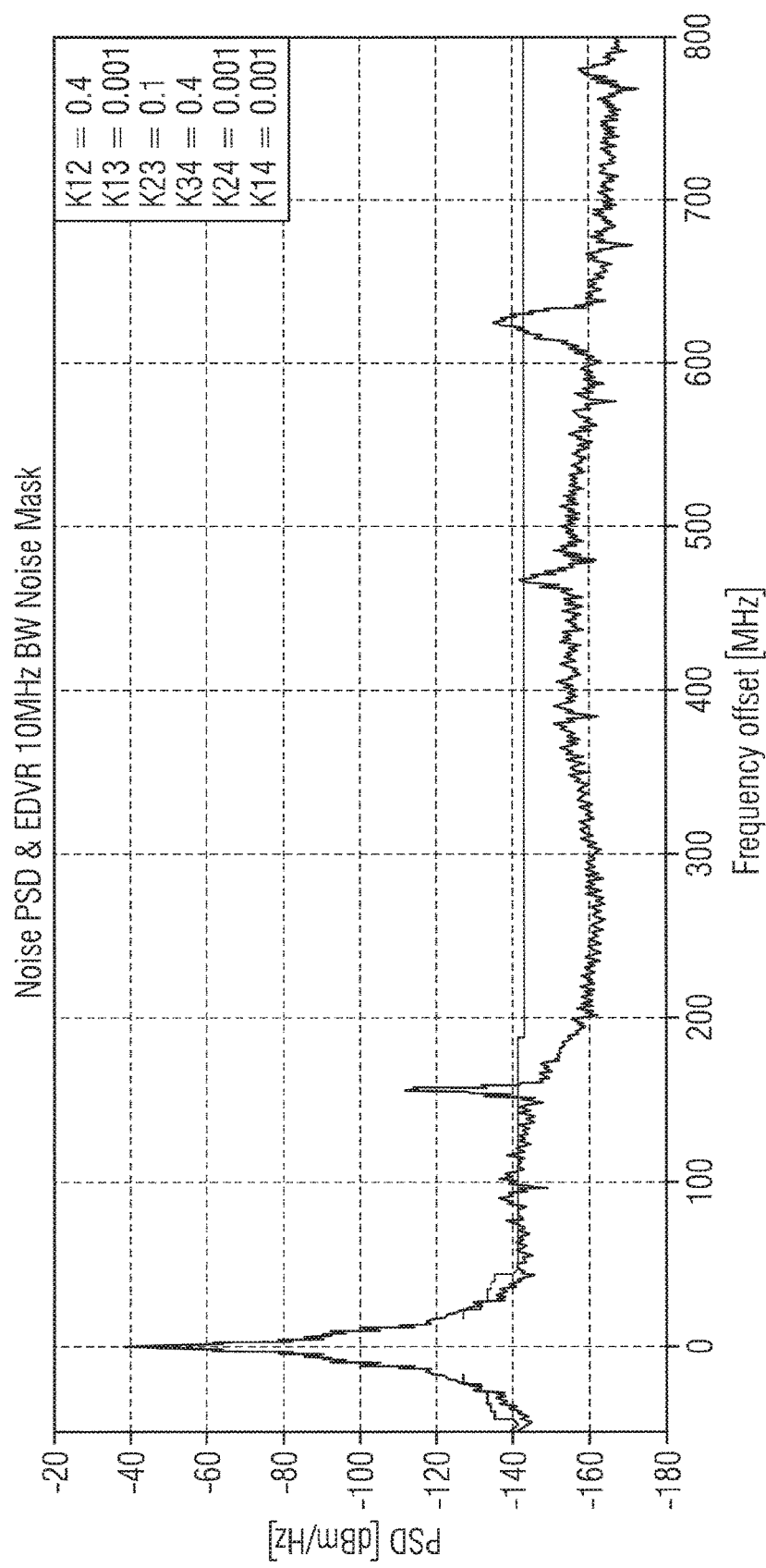
FIG. 6 shows another spur simulation corresponding to the arrangement shown in FIG. 5.

FIG. 6 is a spur simulation for an arrangement with a mismatch between a coupling K23 between the second and third inductor and the coupling K14 between the first and the fourth inductor. Consequently, a one-time switching spur at 1×fs=156 MHz occurs at −112.8 dBm/Hz, for example.

It is desired to minimize the one-time switching spur due to inductor coupling (the magnetic coupling between the inductors of the different phases), for example.

FIG. 1 shows a schematic illustration of a multi-phase amplifier circuit according to an example. The multi-phase amplifier circuit 10 comprises an amplification circuit 12 generates a plurality of phase signals and provides the plurality of phase signals to a plurality of inductors. An inductive coupling K12 between a first pair of inductors L1, L2 differs from an inductive coupling K34 between a second pair of inductors L3, L4 by a first coupling difference. The amplification circuit 12 is configured to provide a plurality of first phase signals (e.g. two phase signals of the plurality of phase signals) comprising a first phase difference of less than about 180° (e.g. less than 170° or less than 160°) to the first pair of inductors L1, L2 and a plurality of second two further phase signals (e.g. two further phase signals of the plurality of phase signals) comprising the first phase difference to the second pair of inductors L3, L4. An inductive coupling K13 between a third pair of inductors L1, L3 differs from an inductive coupling between a fourth pair of inductors L2, L4 by a second coupling difference. The amplification circuit 12 is configured to provide a plurality of third two phase signals (e.g. two phase signals of the plurality of phase signals) comprising a second phase difference of about 180° (e.g. including minor phase variations due to manufacturing and/or delay matching tolerances, while ideally 180° is desired, for example, 180°±1°) to the third pair of inductors L1, L3 and a plurality of fourth two further phase signals (e.g. two further phase signals of the plurality of phase signals) comprising the second phase difference to the fourth pair of inductors L2, L4. Further, an absolute value of the first coupling difference is smaller than or equal to an absolute value of the second coupling difference (e.g. |K12−K34|≤|K13−K24|).

For example, the signal spurs within an amplified signal at the frequency of the phase signals (1×fs) may be significantly reduced due to the improved matching of the pairs with less than 180° phase difference in comparison to the matching of pairs with 180° phase difference. At least a portion of the spurs of pairs, which comprise a good matching, may cancel each other, when the phase signals are added after passing the inductors.

The phase signals are the same signals, but comprise different phase offsets with respect to each other. For example, the phase signals are generated based on phase shifted versions of the same oscillator, clock or trigger signal (e.g. triangular signal or sinusoidal signal). In other words, a phase of a phase signal of the plurality of phase signals may relate to a phase of the oscillator, clock or trigger signal used to generate the phase signal. For example, in a 4-phase amplifier circuit, the phase signals may be shifted by 0°, 90°, 180° and 270° with respect to a reference phase, in a 6-phase amplifier circuit, the phase signals may be shifted by 0°, 60°, 120°, 180°, 240° and 300° with respect to a reference phase and correspondingly for more phases. For example, the phase signal arriving first at a summing node of the plurality of phase signals comprises the reference phase. Although FIG. 1 shows an example of a 4-phase amplifier circuit, the multi-phase amplifier circuit may comprise more than 4 phases (e.g. an 8-phase amplifier circuit, FIG. 8). For example, the number of phase signals generated and output by the amplification circuit 12 is equal to an even number larger than 3.

Each phase signal may be output to a different phase signal path, each comprising an inductor of the plurality of inductors. For example, a number of inductors of the plurality of inductors may be equal to a number of different phase signals generated by the amplification circuit 12. Correspondingly, a number of phase signal paths connected to the amplification circuit 12 may be equal to a number of different phase signals output by the amplification circuit 12.

The first pair of inductors L1, L2 comprises two inductors of the plurality of inductors located within different phase signal paths and the second pair of inductors L3, L4 comprises two other inductors of the plurality of inductors located within two other different phase signal paths. In the example of a 4-phase amplifier circuit as shown in FIG. 1, the plurality of inductors comprises 4 inductors, each inductor being either part of the first or the second pair of inductors and being either part of the third pair of inductors or the fourth pair of inductors. Correspondingly, the third pair of inductors L1, L3 comprises two inductors of the plurality of inductors located within different phase signal paths and the fourth pair of inductors L2, L4 comprises two other inductors of the plurality of inductors located within two other different phase signal paths. For example, in the 4-phase amplifier circuit example, the first pair of inductors L1, L2 and the second pair of inductors L3, L4 comprise different permutations of the same inductors in comparison to the third pair of inductors L1, L3 and the fourth pair of inductors L2, L4.

For example, a first phase signal of the two phase signals, which are provided to the first pair of inductors L1, L2, and a first phase signal of the two phase signals, which are provided to the second pair of inductors L3, L4, comprise a phase difference of 180°. Consequently, signal spurs contained by these two first phase signals may be at least partly cancelled at a summing node of the phase signals. Further, the second phase signal of the two phase signals, which is provided to the other inductor of the first pair of inductors L1, L2, and the second phase signal of the two phase signals, which is provided to the other inductor of the second pair of inductors L3, L4, may comprise a phase difference of 180° as well. Similarly, a first phase signal of the two phase signals provided to the third pair of inductors L1, L3 and a first phase signal of the two phase signals provided to the fourth pair of inductors L2, L4 may comprise a phase difference of 180°.

The inductive coupling (or mutual inductance) is a measure of the coupling between two inductors, for example. The inductive coupling may be measured or indicated in Henry H. Consequently, also the difference between two inductive couplings may be measured or indicated in Henry H.

The first pair of inductors L1, L2 comprises inductors located in phase signal paths conducting phase signals with a phase difference of less than 180°. For example, the first phase difference is equal to an integer multiple of 360° divided by a number of different phase signals output by the amplification circuit 12.

In the example of a 4-phase amplifier circuit as shown in FIG. 1, a first inductor L1 may be provided with a first phase signal or reference phase signal comprising a phase offset of 0° to a reference phase, a second inductor L2 may be provided with a second phase signal comprising a phase offset of 90° to the reference phase, a third inductor L3 may be provided with a third phase signal comprising a phase offset of 180° to the reference phase and a fourth inductor L4 may be provided with a fourth phase signal comprising a phase offset of 270° to the reference phase. In this example, the first pair of inductors L1, L2 comprises the first and the second inductor, the second pair of inductors L3, L4 comprises the third inductor and the fourth inductor, the third pair of inductors comprises the first inductor and the third inductor and the fourth pair of inductors comprises the second inductor and the fourth inductor. Consequently, the first phase difference may be 90° in this example.

The absolute value of the first coupling difference may be substantially equal to the absolute value of the second coupling difference, if the second coupling difference is already very low. For example, the second coupling difference may be less than 20% (or less than 10%, less than 5% or less than 1%) of the inductive coupling K13 between the third pair of inductors or the inductive coupling K24 between the fourth pair of inductors. Alternatively, the absolute value of the first coupling difference may be significantly smaller than the absolute value of the second coupling difference. For example, the absolute value of the first coupling difference is less than 20% (or less than 10%, less than 5% or less than 1%) of the absolute value of the second coupling difference. For example, each pair of inductors conducting phase signals having a phase difference other than about 180° (e.g. less than 170° or larger than 190°) comprises a lower absolute value of a coupling difference with respect to another pair of inductors conducting phase signals having a phase difference other than about 180° (e.g. less than 170° or larger than 190°) than the absolute value of the second coupling difference.

The inductive coupling between two inductors may be influenced by several parameters. For example an inductance of the inductors, a distance between two inductors, the number of windings of the two inductors, the orientation of the two inductors and the shielding between the two inductors can influence the inductive coupling between the two inductors. Therefore, several implementations may be possible to obtain that the absolute value of the first coupling difference is smaller than or equal to the absolute value of the second coupling difference.

For example, the distance between inductors of pairs with large influence on the one time spurs (e.g. first and second pair of inductors) may match better than inductors of pairs with less influence on the one time spurs (e.g. third and fourth pair of inductors). For example, a distance between the inductors of the first pair of inductors L1, L2 differs from a distance between the inductors of the second pair L3, L4 of inductors by a first distance difference and a distance between the inductors of the third pair L1, L3 of inductors differs from a distance between the inductors of the fourth pair of inductors L2, L4 by a second distance difference. The first distance difference may be smaller than a second distance difference. For example, the first distance difference may be less than 20% (or less than 10%, less than 5% or less than 1%) of the second distance difference. Alternatively or additionally, a distance between the inductors of the first pair of inductors differs from a distance between the inductors of the second pair of inductors by less than 1 mm (or less than 3 mm, less than 0.5 mm or less than 0.1 mm). For example, the distance between two inductors may be the distance between the maximum field regions (e.g. centers of coils) of the two inductors.

For example, the amplification circuit 12 may provide a first phase signal to a first inductor L1 of the plurality of inductors, a second phase signal to a second inductor L3 of the plurality of inductors and a third phase signal to a third inductor L4 of the plurality of inductors. A phase difference between the first phase signal and the second phase signal may be 180° and a phase difference between the first phase signal and the third phase signal may be larger than 180°. An inductive coupling between the first inductor L1 and the second inductor L3 may be smaller than an inductive coupling between the first inductor L1 and the third inductor L4. In the example of a 4-phase amplifier circuit as shown in FIG. 1, the first inductor L1 may be provided with the first phase signal or reference phase signal comprising a phase offset of 0° to a reference phase, the second inductor L3 may be provided with the second phase signal comprising a phase offset of 180° to the reference phase and the third inductor L4 may be provided with the third phase signal comprising a phase offset of 270° to the reference phase. For example, the inductive coupling between the first inductor L1 and the second inductor L3 may be smaller than an inductive coupling between the first inductor L1 and the third inductor L4 due to the larger distance between the first inductor L1 and the second inductor L3 in comparison to the distance between the first inductor L1 and the third inductor L4.

The plurality of inductors may be integrated passive devices (IPD) and/or surface-mount device (SMD) attached to a PCB or located in a package. All inductors of the plurality of inductors may be equal (e.g. same component).

For example, each inductor of the plurality of inductors comprises substantially the same inductance. In this way, each inductor of the plurality of inductors generates substantially the same magnetic field (e.g. same magnetic field strength) in response to the same signal. The inductors may comprise coils. For example, the coils of the plurality of inductors may comprise the substantially same number of windings. Further, a direction (orientation) of a magnetic field at a region of a maximal magnetic field (e.g. in the middle of the coil) generated by an inductor of the plurality of inductors may be substantially equal for all inductors of the plurality of inductors for a same signal. In other words, the inductors of the plurality of inductors may be arranged with the same orientation.

The amplification circuit 12 is connected to the plurality of inductors. The amplification circuit 12 may generate the plurality of phase signals based on an input signal (e.g. FIG. 12). For example, the input signal (e.g. envelope tracking control signal or another signal to be amplified) is an analog signal and the amplified output signal is an analog signal. For example, the multi-phase amplifier circuit 10 may be used as a power supply circuit providing a power supply to a power amplifier of a transmitter or transceiver. The transmitter or transceiver may work in an average power mode or an envelope tracking mode. For example, the input signal may be an envelope tracking control signal of a radio frequency transmit signal and the amplified output signal of the multi-phase amplifier circuit 10 may be an envelope tracking power supply signal for a power amplifier configured to amplify the radio frequency transmit signal. Alternatively, the input signal may be an audio signal and the amplified output signal of the multi-phase amplifier circuit 10 may be an amplified audio signal.

For example, the multi-phase amplifier circuit 10 generates an amplified output signal based on the plurality of phase signals. The amplified output signal may be generated based on a summation of the phase signals at a summing node (e.g. FIG. 12) after passing the plurality of inductors. The amplified output signal may correspond to an amplified version of an input signal of the amplification circuit 12 or an amplitude of the amplified output signal may be adjusted by the input signal of the amplification circuit 12.

The multi-phase amplifier circuit 10 may be a multi-phase digital amplifier (e.g. a class D amplifier, switching amplifier). At least a part (e.g. the amplification circuit) of the multi-phase amplifier circuit 10 may be implemented on a semiconductor die. The plurality of inductors may be arranged on a printed circuit board connected to the semiconductor die or may be arranged in a common package (e.g. system in package) with the semiconductor die.

More details and aspects are mentioned in connection with the examples described above or below. The example shown in FIG. 1 may comprise one or more optional additional features corresponding to one or more aspects mentioned in connection with the proposed concept or one or more examples described above and below (e.g. FIGS. 2-15).

Figure 2:
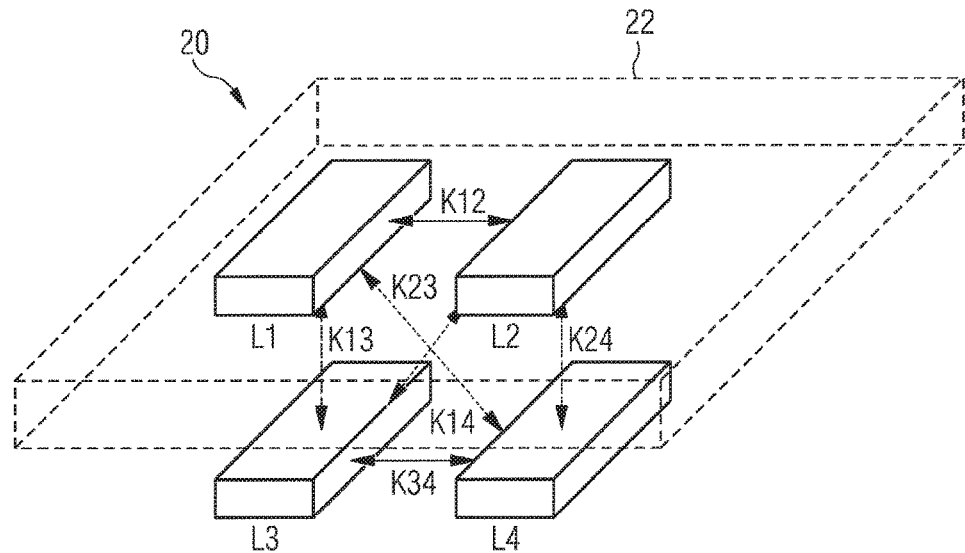
FIG. 2 shows a schematic illustration of an arrangement of inductors of a 4-phase amplifier circuit.

FIG. 2 shows a schematic of an arrangement 20 of a plurality of inductors L1, L2, L3, L4 placed symmetrically about the PCB 22 (or within a package). By this placement, the coupling between the inductor pairs are made to effect the first coupling difference being substantially equal to the second coupling difference as described above, for example. Likewise, a compact arrangement of the inductors on the PCB 22 may be implemented into small spaces while providing a cost saving and increased design choice. As shown, a first pair of inductors L1, L2 is arranged adjacent, in a lateral direction, on the same side of the PCB 22 and separated by a first distance which effects a first inductive coupling K12. Likewise, a second pair of inductors L3, L4 is also arranged adjacent, in a lateral direction, on the same side of the PCB 22 opposite to the first pair and separated by substantially the first distance as well which effects a second inductive coupling K34. A third pair of inductors L1, L3 is arranged adjacent, in a vertical direction, on different sides of the PCB 22 and separated by a second distance which effects a third inductive coupling K13. While a fourth pair of inductors L2, L4 is arranged adjacent, in a vertical direction, on different sides of the PCB 22 and separated by substantially the second distance as well which effects a fourth inductive coupling K14. Another pair of inductors arranged to effect an inductive coupling is depicted with first inductor L1 and fourth inductor L4 forming an inductive coupling K14. Still another pair of inductors arranged to effect an inductive coupling is depicted with second inductor L2 and third inductor L3 forming an inductive coupling K23. By these arrangement and as described above, the one-time switching spur may be reduced while the inductors may be positioned more closely together so as to facilitate implementation in a variety of devices (e.g. audio amplifier or envelope tracking amplifier for the LTE and UMTS radio frequency transmit RF-TX Power Amplifier, which delivers the envelope modulated power supply for such radio frequency power amplifiers RF-PAs). FIG. 2 shows a highly symmetrical placement to avoid or reduce spurs due to inductor coupling.

More details and aspects are mentioned in connection with the examples described above or below. The example shown in FIG. 2 may comprise one or more optional additional features corresponding to one or more aspects mentioned in connection with the proposed concept or one or more examples described above (e.g. FIG. 1) and below (e.g. FIGS. 3-15).

Figure 3:
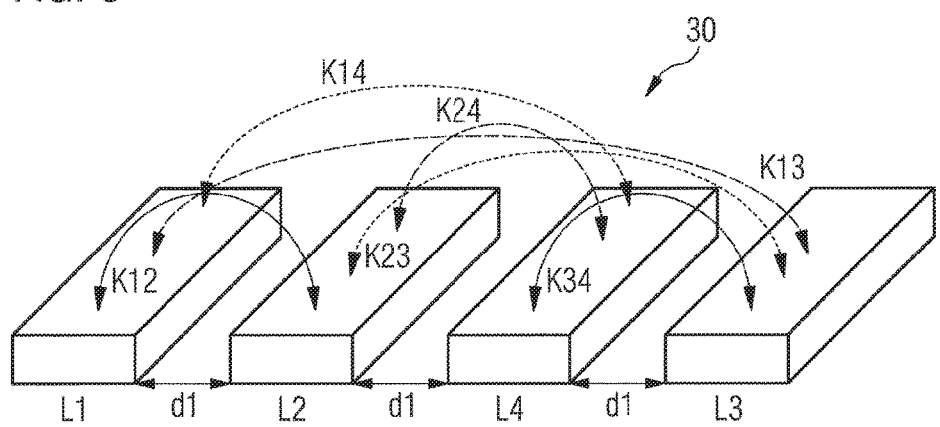
FIG. 3 shows a schematic illustration of another arrangement of inductors of a 4-phase amplifier circuit.

FIG. 3 shows another schematic of another arrangement 30 of a plurality of inductors. The arrangement corresponds to the arrangement shown in FIG. 1, for example. Each of the inductors is separated by a substantially similar or equal distance d1 from neighboring inductors. More details and aspects are mentioned in connection with FIG. 1.

It may be shown—to minimize the 1×fs spur—that the phases of one phase pair may need a good or perfect matching but the matching between the phase pairs may be unimportant.

For inductor coupling that may mean that the inductor coupling between L1 and L2 (K12) and the inductor coupling between L3 and L4 (K34) may need to match. The inductor coupling between L1 and L4 (K14) and between L2 and L3 (K23) may need to match also. But the inductor coupling between L1 and L3 (K13) and the coupling between L2 and L4 (K24) may be unnecessary to match.

This finding may be used to place the inductor on the PCB/Package in a way that the generation of a 1×fs spur in the system due to inductor coupling may be avoided. A condition that may enable that both spur components are cancelled may be K12=K34 and K23=K14. K13 and K24 may have no impact on the 1×fs spur. They may have impact on higher spurs but that may be of lower importance because higher spurs may be attenuated by output filtering.

In the four channel case, the coupling matrix:
K12
K13 K23
K14 K24 K34 may be reduced to the specific matrix:
K12
- - - K14
K14 - - - K12

The bars - - - indicate that the corresponding coupling factor is less or not important.

Making use of the aspect that k13 and k24 do not need to match, an according ordering of the inductors may be possible. The inductor/phase ordering of FIG. 3 may avoid generating a 1×fs spur due to inductor coupling. Due to this phase ordering, a good matching of k12/k34 and k14/k23 can be archived. The matching of k13/k24 is bad but does not impact the 1×fs spur, for example.

Figure 4:
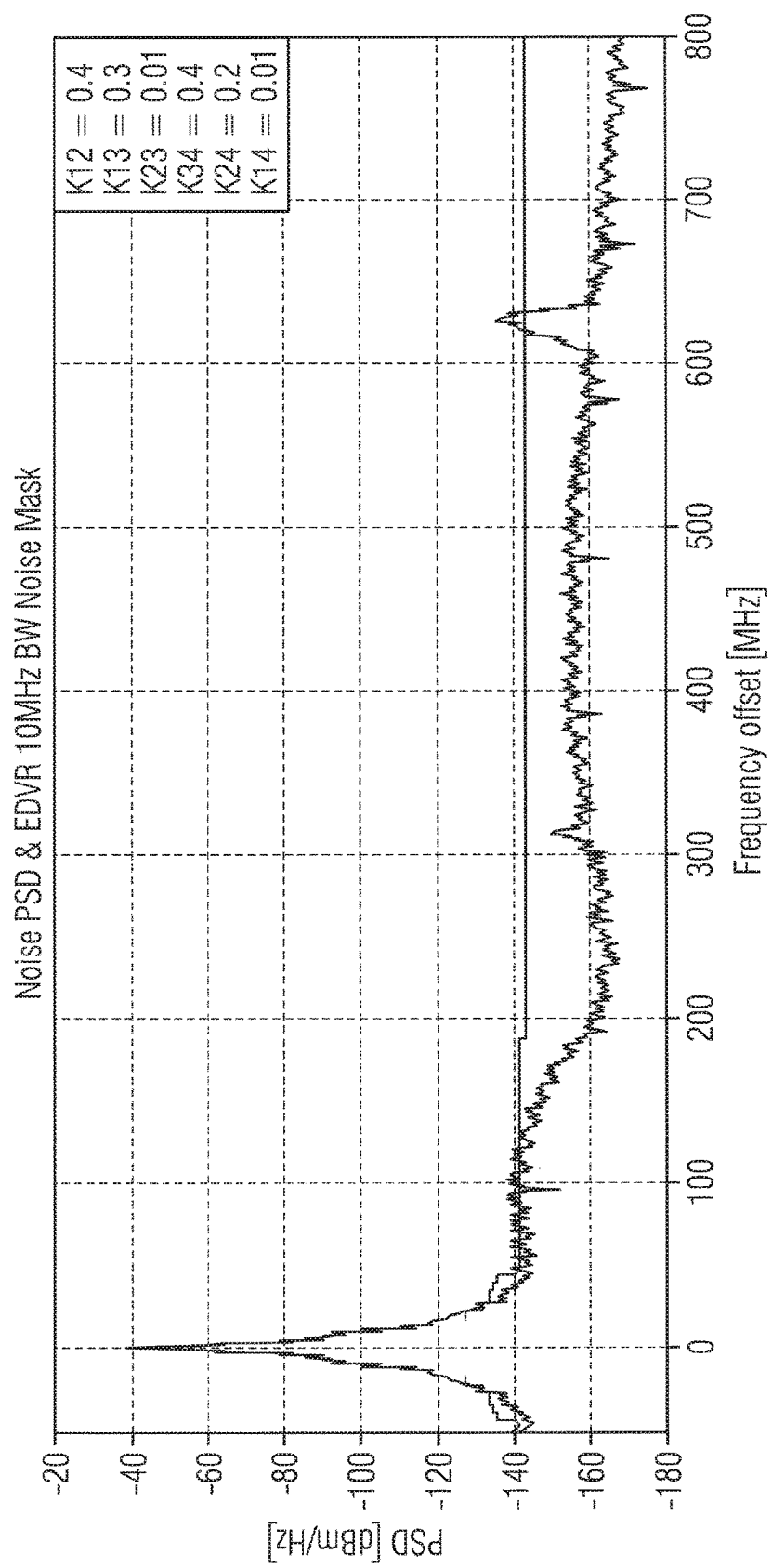
FIG. 4 shows a spur simulation corresponding to the arrangement shown in FIG. 3.

FIG. 4 depicts a spur simulation for a four inductor arrangement as shown in FIG. 3 with k13 and k24 mismatch. A one-time switching spur is reduced or avoided at 156 MHz.

Figure 7:
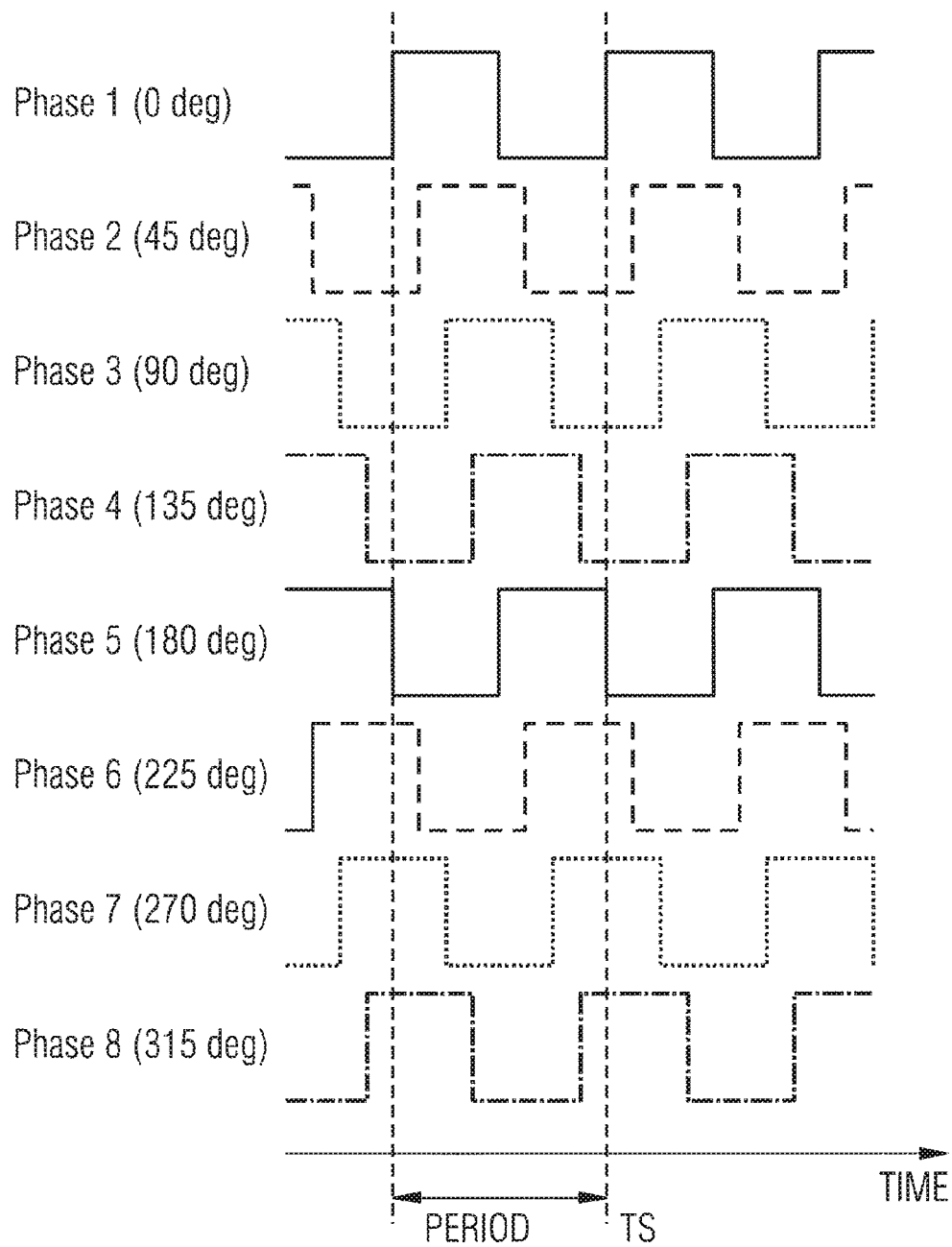
FIG. 7 shows voltage waveforms of eight phases driving inductors of an 8-phase amplifier circuit.

Some examples relate to an 8-phase amplifier circuit. An 8-phase amplifier circuit may comprise an amplification circuit configured to output eight different phase signals. The phase signals may correspond to a phase shift of 0°, 45°, 90°, 125°, 180°, 225°, 270° and 315° with respect to a reference phase as shown in FIG. 7. Further, the period TS of the phase signals is indicated.

In an 8-channels system the phases are shifted by 45 degree each. The phases 1/5, 2/6, 3/7 and 4/8 are shifted by 180 degrees to each other. That means they may build a phase pair and in total there may be 4-phase pairs. To cancel or reduce the 1×fs spur the necessary condition may be that the first harmonic of the phase pairs are matching. In that case they may be canceled as they are 180° phase shifted.

The inductive coupling between the phases of such phase pairs may be of no importance for the 1×fs spur. The impact of this coupling may affect both phases in the same way so summing
with 180° may still cancel the first harmonic, for example. That may mean that k15, k26, k37 and k48 can have arbitrary values. FIG. 9 shows this relationship for phase pairs in an 8-channel system.

Further, the coupling into one phase of a phase pair may need to be the same (but inverted) as the coupling into the other phase of that phase pair. FIGS. 10A and 10B show the possible cross-coupling paths between phase pairs.

As a result the following conditions for the cross-coupling coefficients may be needed to be fulfilled for not generating a 1×fs spur:
$k_{1,2}=k_{5,6}$, $k_{1,3}=k_{5,6}$, $k_{1,4}=k_{5,8}$, $k_{1,6}=k_{2,5}$, $k_{1,7}=k_{3,5}$, $k_{1,8}=k_{4,8}$
$k_{2,3}=k_{6,7}$, $k_{2,4}=k_{6,8}$, $k_{2,7}=k_{3,6}$, $k_{2,8}=k_{4,6}$
$k_{3,4}=k_{7,8}$, $k_{3,8}=k_{4,7}$ The relations for the remaining coefficients may be written as:

| | | | |
|---|---|---|---|
| $k_{1,2}=k_{5,6}$ | | | |
| $k_{1,3}=k_{5,7}$ | $k_{2,3}=k_{6,7}$ | | |
| $k_{1,4}=k_{5,8}$ | $k_{2,4}=k_{6,8}$ | $k_{3,4}=k_{7,8}$ | |
| $k_{1,5}$ | $k_{2,5}=k_{1,6}$ | $k_{3,5}=k_{1,7}$ | $k_{4,5}=k_{1,8}$ |
| $k_{1,6}=k_{2,5}$ | $k_{2,6}$ | $k_{3,6}=k_{2,7}$ | $k_{4,6}=k_{2,8}$ |
| $k_{1,7}=k_{3,5}$ | $k_{2,7}=k_{3,6}$ | $k_{3,7}$ | $k_{4,7}=k_{3,8}$ |
| $k_{1,8}=k_{4,5}$ | $k_{2,8}=k_{4,6}$ | $k_{3,8}=k_{4,7}$ | $k_{4,8}$ |

In the 8-channel case, the general coupling matrix is:
K12
K13 K23
K14 K24 K34
K15 K25 K35 K45
K16 K26 K36 K46 K56
K17 K27 K37 K47 K57 K67
K18 K28 K38 K48 K58 K68 K78

The specific matrix may be:
K12
K13 K23
K14 K24 K34
- - - K16 K17 K18
K16 - - - K27 K28 K12
K17 K27 - - - K38 K13 K23
K18 K28 K38 - - - K14 K24 K34

Figure 8:
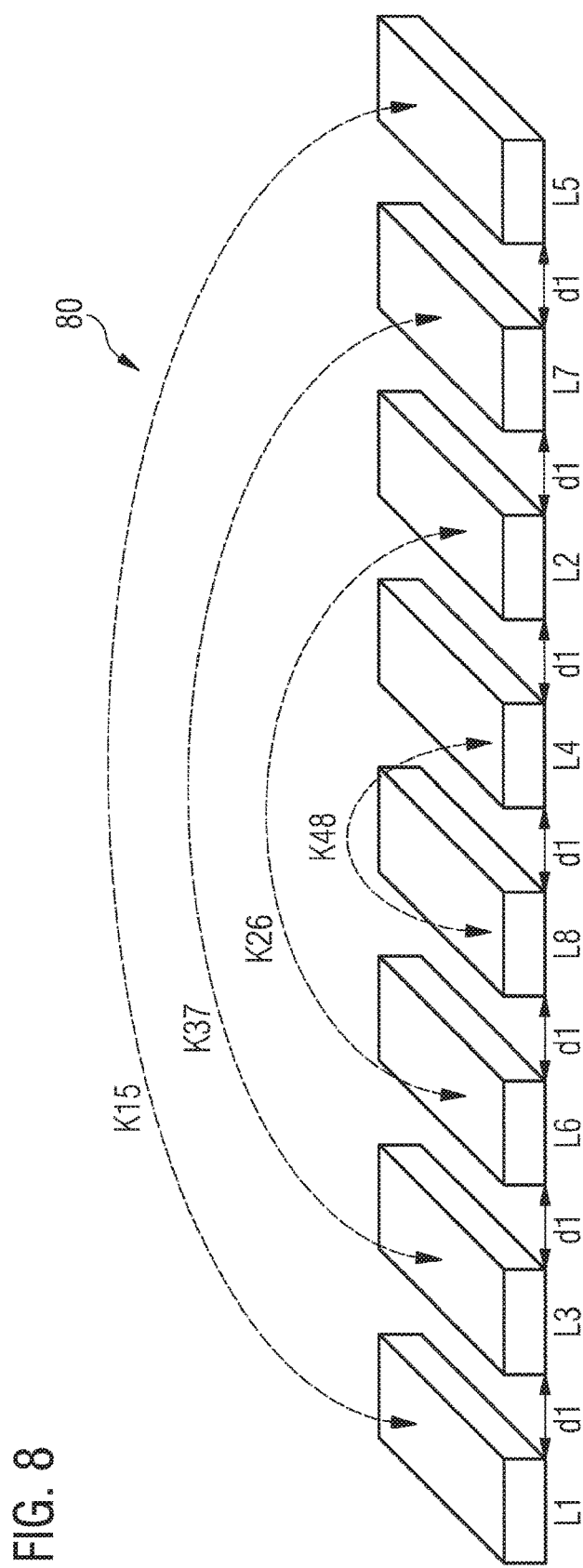
FIG. 8 shows a schematic illustration of an arrangement of inductors of an 8-phase amplifier circuit.

A possible arrangement of inductors (coils) in a line may be L1-L3-L6-L8-L4-L2-L7-L5 corresponding to a sequence for the phases of the phase signals being 0°-90°-225°-315°-135°-45°-270°-180°. A schematic illustration of a possible arrangement 80 of the inductors of an 8-phase amplifier circuit is shown in FIG. 8. Phase pairs k15, k26, k37 and k48 with low or no importance for the generation of 1×fs spurs are indicated.

For example, a proposed 8-phase amplifier circuit may be used as an audio amplifier for amplifying audio signals.

More details and aspects are mentioned in connection with the examples described above or below. The example shown in FIG. 8 may comprise one or more optional additional features corresponding to one or more aspects mentioned in connection with the proposed concept or one or more examples described above (e.g. FIGS. 1-7 and 9-10B) and below (e.g. FIGS. 11-15).

Figure 11:
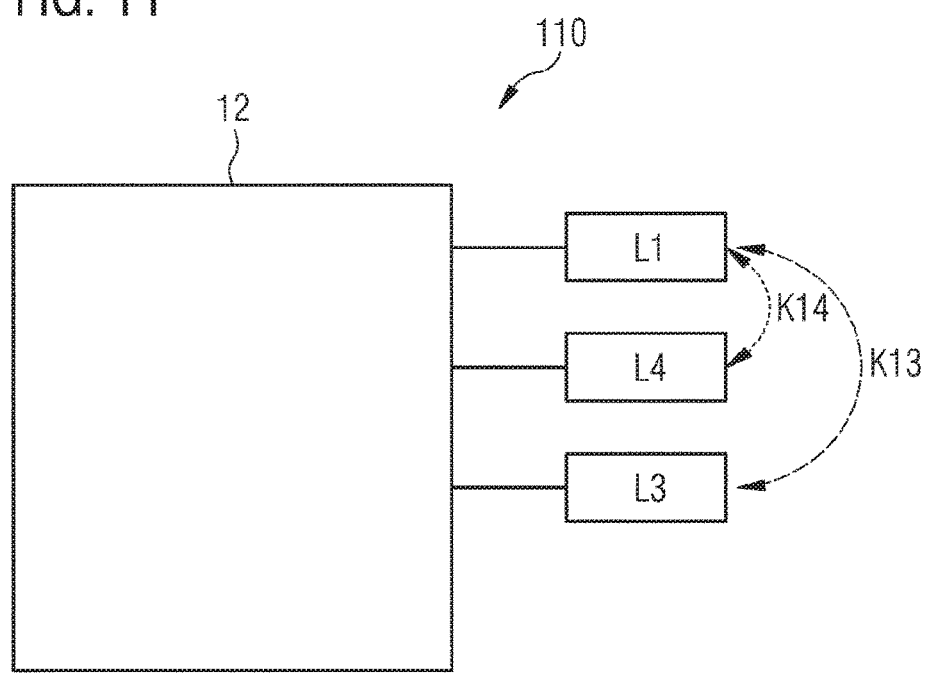
FIG. 11 shows a schematic illustration of a multi-phase amplifier circuit.

FIG. 11 shows a schematic illustration of a multi-phase amplifier circuit 110 according to an example. The multi-phase amplifier circuit 110 comprises an amplification circuit 12 configured to generate a plurality of phase signals and to provide the plurality of phase signals to a plurality of inductors. The amplification circuit 12 is configured to provide a first phase signal to a first inductor L1 of the plurality of inductors, a second phase signal to a second inductor L3 of the plurality of inductors and a third phase signal to a third inductor L4 of the plurality of inductors. A phase difference between the first phase signal and the second phase signal is about 180° (e.g. including minor phase variations due to manufacturing and/or delay matching tolerances, while ideally 180° is desired, for example, 180°±1°) and a phase difference between the first phase signal and the third phase signal is larger than about 180° (e.g. larger than 190° or larger than 200°). An inductive coupling between the first inductor L1 and the second inductor L3 is smaller than an inductive coupling between the first inductor L1 and the third inductor L4.

For example, the signal spurs within an amplified signal at the frequency of the phase clock (1×fs) may be significantly reduced due to the lower inductive coupling of the inductors with phase differences unequal 180°.

The inductive coupling between two inductors may be influenced by various parameters as mentioned above. For example, the distance between the inductors on a PCB or in a package may be selected to adjust the inductive coupling. For example, a distance between the first inductor L1 and the second inductor L3 may be larger than a distance between the first inductor L1 and the third inductor L4.

More details and aspects are mentioned in connection with the examples described above or below. The example shown in FIG. 11 may comprise one or more optional additional features corresponding to one or more aspects mentioned in connection with the proposed concept or one or more examples described above (e.g. FIGS. 1-10B) and below (e.g. FIGS. 12-15).

Figure 12:
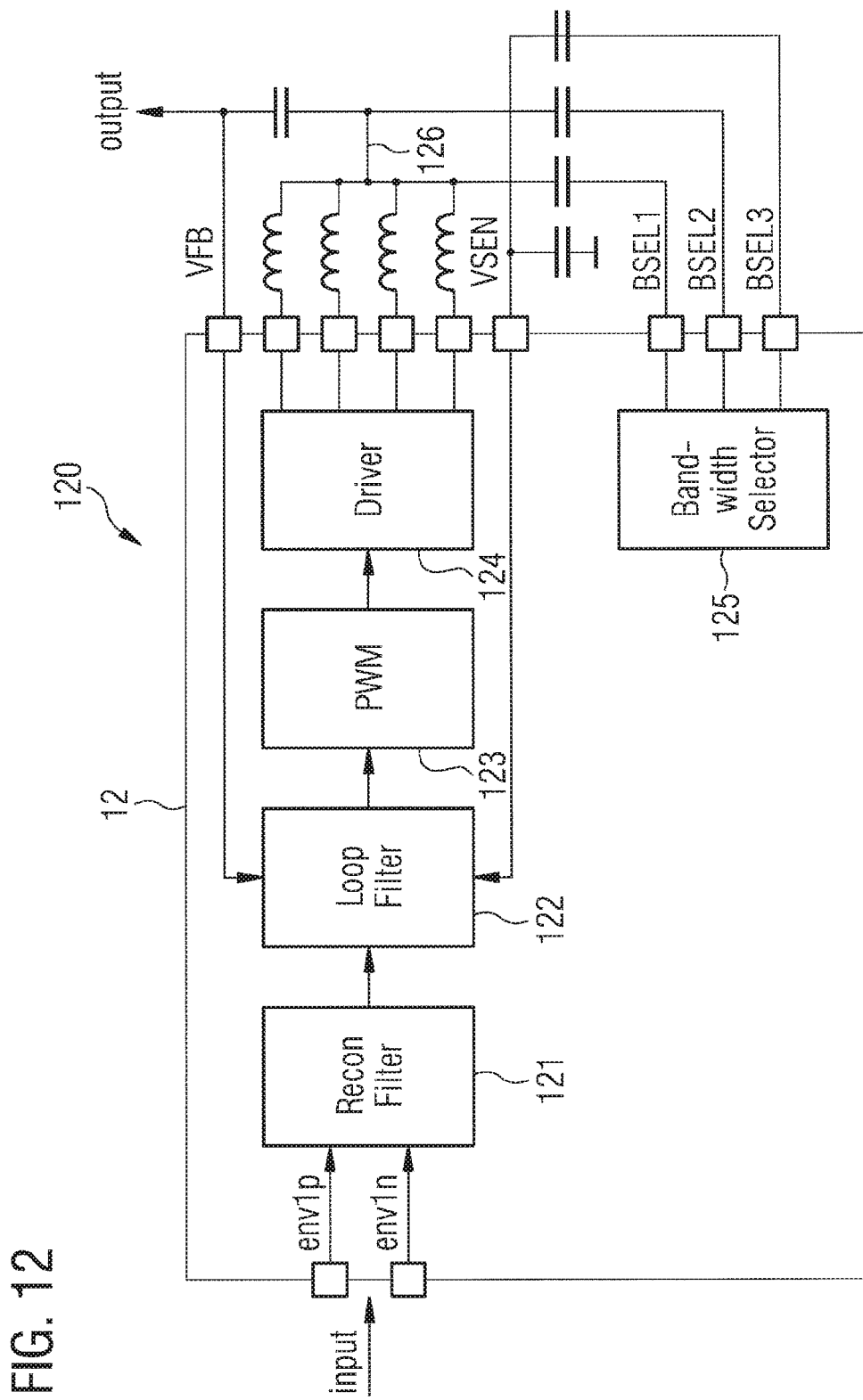
FIG. 12 shows a block diagram of a multi-phase amplifier circuit.

FIG. 12 depicts a digital 4-phase wide-band amplifier 120. The amplifier 120 may be a Class-D amplifier or switching amplifier wherein the amplifying devices operate as electronic switches. The signal to be amplified may be either a train of constant amplitude pulses, so the active devices switch rapidly between fully conductive and nonconductive states or an analog differential signal. In the depicted example, the switching frequency in one phase may be 75-150 MHz with an overall switching frequency of 300-600 MHz. The analog signal to be amplified is converted into a series of pulses before being applied to an amplifier (PWM 123). After amplification, the output pulse train will be converted back to an analog signal by passing it through a programmable low pass filter comprising inductors and capacitors. The amplifier 120 may comprise improved efficiency and less power dissipation through heat.

The amplifier structure includes an input for receiving differential envelope input signals env1p, env1n, which are provided to a reconstruction filter 121 (Recon Filter). The reconstruction filter 121 may be used to construct a smooth analog signal from differential input. It may limit the bandwidth to the bandwidth of the following amplifier. The analog output signal from the reconstruction filter 121 is provided to a loop filter 122 providing an output feedback loop for better linearity of the amplifier. The loop-filter output signal is provided to a pulse width modulator (PWM) 123 which converts the incoming loop-filter output signal into a series of pulses by making use of a high speed comparator that compares a high frequency triangular wave with the incoming analog output. Each phase signal may be generated by using the high frequency triangular wave signal with different phase offsets. The series of pulses output of the PWM may then be used to drive driver 124 which include an inverter arrangement such as MOS gate driver configured to drive a pair of high-power switches, such as MOSFETs. The driver output signal of driver 124 may be an amplified replica of the comparators PWM signal. Driver 124 is arranged with four phase signal output paths (consistent with the 4 phases), each having an inductor and each converging onto a summing node 126 leading to a common output of the summation of the four phase signal paths. Optionally, a bandwidth selector 125 is arranged to provide programmable filtering, via a number of capacitors connected to the summing node 126 operating in conjunction with the inductors, which may operate as low pass filter. Feedback signals may be provided from the common output and the summing node 126 to the loop filter 122. The phase signals provided to the inductors are each phase shifted by 90 degrees. The inductors may be arranged according to the proposed concept (e.g. FIG. 1 and/or FIG. 11).

A proportional integral derivative (PID) controller may be implemented in the digital 4-phase wide-band amplifier 120 to continuously calculate an error value as a difference between a measured process variable and a desired set point. Strategically arranged and configured feedback loops may then be employed to adjust and control variables to reach the desired set point. An inner feedback loop may be arranged between the common output and the loop filter 122 and may be configured to provide local feedback for controlling the P (present value of the error, namely large or small) and D (predicted future value of the error based upon its current rate of change) components of the control to the loop filter 122, for example. An outer feedback loop may be arranged between the common output and the input into reconstruction filter, and may be configured to provide DC feedback from the power amplifier as may be related to an output signal at the common output (e.g. a voltage signal related to a voltage output signal).

FIG. 12 shows an example of a digital 4-phase wide-band amplifier. It is based on a PWM modulation of four phases, each phase shifted by 90 degree. The output filter bandwidth is programmable and the output is AC coupled, for example.

More details and aspects are mentioned in connection with the examples described above or below. The example shown in FIG. 12 may comprise one or more optional additional features corresponding to one or more aspects mentioned in connection with the proposed concept or one or more examples described above (e.g. FIGS. 1-11) and below (e.g. FIGS. 13-15).

Figure 13:
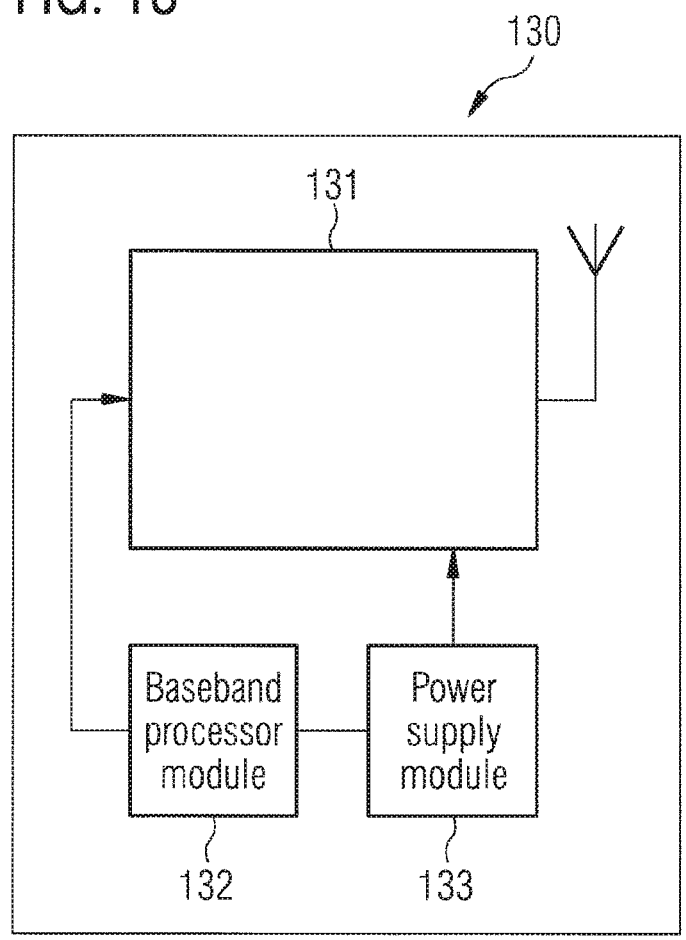
FIG. 13 shows a schematic illustration of a mobile device.

FIG. 13 shows a schematic illustration of a mobile device 130 according to an example. The mobile device 130 may be a cell phone capable of making and receiving wireless phone calls, and transmitting and receiving data, or a laptop configured to transmit and receive data through a mobile communication network. The mobile device 130 may be a smart phone that, in addition to making and receiving phone calls, runs any number or types of applications. The mobile device 130 comprises a transceiver circuit 131 for generating a radio frequency transmit signal, and a baseband processor module 132 for generating a baseband transmit signal and providing the baseband transmit signal to the transceiver circuit 131 for generating the radio frequency transmit signal. Additionally, the mobile device 130 comprises a power supply unit 133 supplying at least the transceiver circuit 131 and the baseband processor module 32 with power. Further, the mobile device 130 comprises an antenna connected to the transceiver circuit 131 for transmitting the radio frequency transmit signal provided by the transceiver circuit 131.

The power supply module 133 or the transceiver circuit 131 may comprise a proposed multi-phase amplifier circuit.

More details and aspects are mentioned in connection with the examples described above or below. The example shown in FIG. 13 may comprise one or more optional additional features corresponding to one or more aspects mentioned in connection with the proposed concept or one or more examples described above (e.g. FIGS. 1-12) and below (e.g. FIGS. 14-15).

Various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WI-MAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

Figure 14:
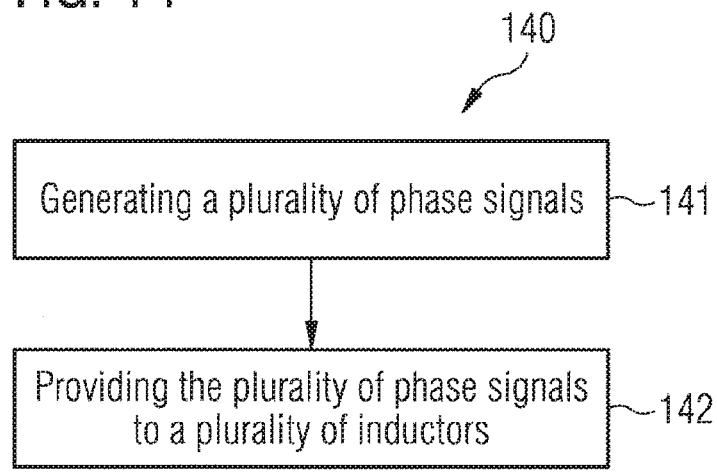
FIG. 14 shows a flowchart of a method for generating an amplified output signal.

FIG. 14 shows a flowchart of a method for generating an amplified output signal according to an example. The method 140 for generating an amplified output signal comprises generating 141 a plurality of phase signals and providing 142 the plurality of phase signals to a plurality of inductors. An inductive coupling between a first pair of inductors differs from an inductive coupling between a second pair of inductors by a first coupling difference. Further, two phase signals comprising a first phase difference of less than 180° are provided to the first pair of inductors and two further phase signals comprising the first phase difference are provided to the second pair of inductors. An inductive coupling between a third pair of inductors differs from an inductive coupling between a fourth pair of inductors by a second coupling difference. Further, two phase signals comprising a second phase difference of 180° are provided to the third pair of inductors and two further phase signals comprising the second phase difference are provided to the fourth pair of inductors. An absolute value of the first coupling difference is smaller than or equal to an absolute value of the second coupling difference.

For example, the signal spurs within an amplified signal at the frequency of the phase signals (1×fs) may be significantly reduced due to the improved matching of the pairs with less than 180° phase difference in comparison to the matching of pairs with 180° phase difference. At least a portion of the spurs of pairs, which comprise a good matching, may cancel each other, when the phase signals are added after passing the inductors.

More details and aspects are mentioned in connection with the examples described above or below. The example shown in FIG. 14 may comprise one or more optional additional features corresponding to one or more aspects mentioned in connection with the proposed concept or one or more examples described above (e.g. FIGS. 1-13) and below (e.g. FIG. 15).

Figure 15:
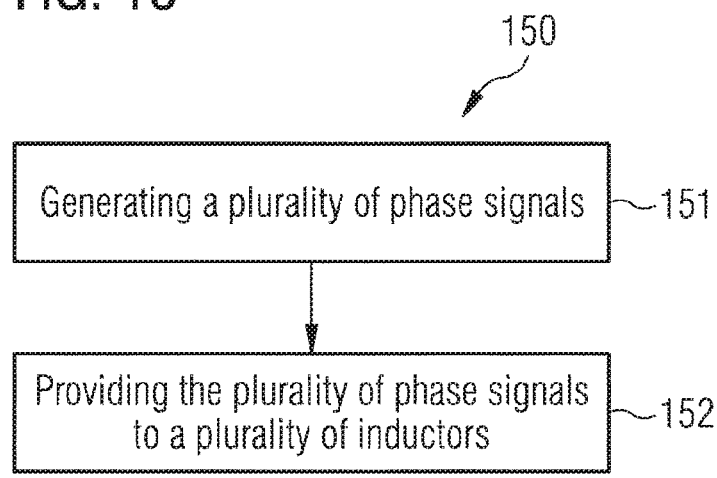
FIG. 15 shows a flowchart of another method for generating an amplified output signal.

FIG. 15 shows a flowchart of another method for generating an amplified output signal according to an example. The method 150 comprises generating 151 a plurality of phase signals and providing 152 the plurality of phase signals to a plurality of inductors. A first phase signal is provided to a first inductor of the plurality of inductors, a second phase signal is provided to a second inductor of the plurality of inductors and a third phase signal is provided to a third inductor of the plurality of inductors. Further, a phase difference between the first phase signal and the second phase signal is 180° and a phase difference between the first phase signal and the third phase signal is larger than 180°. An inductive coupling between the first inductor and the second inductor is smaller than an inductive coupling between the first inductor and the third inductor.

For example, the signal spurs within an amplified signal at the frequency of the phase signals (1×fs) may be significantly reduced due to the lower inductive coupling of the inductors with phase differences unequal 180°.

More details and aspects are mentioned in connection with the examples described above or below. The example shown in FIG. 15 may comprise one or more optional additional features corresponding to one or more aspects mentioned in connection with the proposed concept or one or more examples described above (e.g. FIGS. 1-14) and below.

Some examples relate to minimizing spurs in a multi-channel switched mode amplifier due to phase ordering. A multi-phase-class-D-amplifier or multi-phase-DC/DC-converter with spur-cancel may be proposed. An envelope tracking power amplifier may be implemented based on the proposed concept.

Inductive coupling in a multi-phase amplifier is a big concern because it may only be avoided so far by distance between the inductors, magnetic shielding of the coils and/or highly symmetrical placement. For example, magnetic shielded inductors or large distance between the inductors may be used.

Increasing the distance is very difficult for small form factor devices (e.g. tablets, mobile phones) because PCB area is very limited. Further, an integration of the inductors into the chip package to save PCB area may be desired. For this, the inductors have to be placed extremely narrow, for example. Further, a magnetic shielding of the coils may be expensive and large. Furthermore, a highly symmetrical placement may be difficult because the inductors need to be inside a shield chamber. Putting both PCB sides into a shield chamber is expensive and may create additional asymmetries, for example. In other words, magnetic shielded inductors may be larger and more expensive, large distance may require large PCB sizes and are not an option for small form-factor devices. In addition large distance may be technical very critical because high speed (150 MHz power signals) cannot be routed easily over large distances.

The proposed concept may enable to reduce the 1×fs spurs significantly at low cost and low space consumption.

The implementation of an envelope tracking amplifier based on a 4-phase digital wideband amplifier may be difficult without using the proposed concept. For example, an envelope power amplifier for the LTE and UMTS RF-TX Power Amplifier may be enabled. It delivers the envelope modulated power supply for such RF-Pas, for example. A spur sensitive digital 4-phase amplifier may be implemented based on the proposed concept.

The proposed concept may be used in any product that requires an efficient power amplifier (e.g. audio, IoT (internet of things), wearables, envelope tracking for RF power amplifier). For example, for an RF power amplifier it may be the only way to get the inductor coupling under control for single side PCB mounting.

The proposed concept may be implemented in high volume products, embodied in computer system architecture features and interfaces made in high volumes, encompass IA (integrated architectures), devices (e.g. transistors) and/or associated mfg (manufacturing) processes, for example.

In the following, examples pertain to further examples. Example 1 is multi-phase amplifier circuit comprising an amplification circuit configured to generate a plurality of phase signals for a plurality of inductors, comprising a first pair of inductors having a first inductive coupling that is different from an inductive coupling of a second pair of inductors by a first coupling difference, an amplification circuit configured to provide a plurality of first phase signals comprising a first phase difference of less than about 180° to the first pair of inductors and a plurality of second phase signals comprising the first phase difference to the second pair of inductors and a third pair of inductors having an inductive coupling that is different from an inductive coupling of a fourth pair of inductors by a second coupling difference, wherein the amplification circuit is configured to provide a plurality of third phase signals comprising a second phase difference of about 180° to the third pair of inductors and a plurality of fourth phase signals comprising the second phase difference to the fourth pair of inductors, wherein an absolute value of the first coupling difference is smaller than or equal to an absolute value of the second coupling difference.

In example 2, the subject matter of example 1 can optionally include a first phase signal of the plurality of first phase signals provided to the first pair of inductors and a first phase signal of the plurality of second phase signals provided to the second pair of inductors comprising a phase difference of about 180°.

In example 3, the subject matter of example 1 or 2 can optionally include the first phase difference being equal to an integer multiple of about 360° divided by a number of different phase signals output by the amplification circuit.

In example 4, the subject matter of one of the examples 1-3 can optionally include a first phase signal of the plurality of third phase signals provided to the third pair of inductors and a first phase signal of the plurality of fourth phase signals provided to the fourth pair of inductors comprising a phase difference of about 180°.

In example 5, the subject matter of one of the examples 1-4 can optionally include comprising a number of phase signal paths connected to the amplification circuit equal to a number of different phase signals output by the amplification circuit, wherein each phase signal path comprises an inductor of the plurality of inductors.

In example 6, the subject matter of example 5 can optionally include the phase signal paths being connected to a summing node, wherein an amplified output signal of the multi-phase amplifier circuit is generated based on a sum of the plurality of phase signals at the summing node.

In example 7, the subject matter of example 6 can optionally include at least one filter capacitor being connected to an output signal path located between the summing node and an output of the multi-phase amplifier circuit, wherein the plurality of inductors and the at least one filter capacitors form a low-pass filter.

In example 8, the subject matter of example 7 can optionally include a filter bandwidth controller configured to adjust a capacitance of the at least one filter capacitor.

In example 9, the subject matter of one of the examples 1-8 can optionally include the first coupling difference being less than about 20% of the second coupling difference.

In example 10, the subject matter of one of the examples 1-9 can optionally include a number of different phase signals output by the amplification circuit being an even number larger than 3.

In example 11, the subject matter of one of the examples 1-10 can optionally include all inductors of the plurality of inductors comprise substantially the same inductance.

In example 12, the subject matter of one of the examples 1-11 can optionally include a direction of a magnetic field at a region of a maximal magnetic field generated by an inductor of the plurality of inductors being substantially equal for all inductors of the plurality of inductors for a same signal.

In example 13, the subject matter of one of the examples 1-12 can optionally include a distance between the inductors of the first pair of inductors differing from a distance between the inductors of the second pair of inductors by a first distance difference, wherein a distance between the inductors of the third pair of inductors differs from a distance between the inductors of the fourth pair of inductors by a second distance difference, and wherein the first distance difference is smaller than a second distance difference.

In example 14, the subject matter of one of the examples 1-13 can optionally include a distance between the inductors of the first pair of inductors differing from a distance between the inductors of the second pair of inductors by less than 1 mm.

In example 15, the subject matter of one of the examples 1-14 can optionally include the amplification circuit configured to provide a first phase signal to a first inductor of the plurality of inductors, a second phase signal to a second inductor of the plurality of inductors and a third phase signal to a third inductor of the plurality of inductors, wherein a phase difference between the first phase signal and the second phase signal is about 180° and a phase difference between the first phase signal and the third phase signal is larger than about 180°, wherein an inductive coupling between the first inductor and the second inductor is smaller than an inductive coupling between the first inductor and the third inductor.

In example 16, the subject matter of examples 15 can optionally include a distance between the first inductor and the second inductor being larger than a distance between the first inductor and the third inductor.

In example 17, the subject matter of one of the examples 1-16 can optionally include each pair of inductors conducting phase signals having a phase difference other than about 180° comprising a lower coupling difference with respect to another pair of inductors conducting phase signals having a phase difference other than about 180° than the second coupling difference.

Example 18 is a multi-phase amplifier circuit comprising an amplification circuit configured to generate a plurality of phase signals and to provide the plurality of phase signals to a plurality of inductors, wherein the amplification circuit is configured to provide a first phase signal to a first inductor of the plurality of inductors, a second phase signal to a second inductor of the plurality of inductors and a third phase signal to a third inductor of the plurality of inductors, wherein a phase difference between the first phase signal and the second phase signal is about 180° and a phase difference between the first phase signal and the third phase signal is larger than about 180°, wherein an inductive coupling between the first inductor and the second inductor is smaller than an inductive coupling between the first inductor and the third inductor.

In example 19, the subject matter of example 18 can optionally include a distance between the first inductor and the second inductor being larger than a distance between the first inductor and the third inductor.

In example 20, the subject matter of one of the examples 18-19 can optionally include a number of phase signal paths connected to the amplification circuit equal to a number of different phase signals output by the amplification circuit, wherein each phase signal path comprises an inductor of the plurality of inductors.

In example 21, the subject matter of example 20 can optionally include the phase signal paths being connected to a summing node, wherein an amplified output signal of the multi-phase amplifier circuit is generated based on a sum of the plurality of phase signals at the summing node.

In example 22, the subject matter of example 21 can optionally include at least one filter capacitor being connected to an output signal path located between the summing node and an output of the multi-phase amplifier circuit, wherein the plurality of inductors and the at least one filter capacitors form a low-pass filter.

In example 23, the subject matter of example 22 can optionally include a filter bandwidth controller configured to adjust a capacitance of the at least one filter capacitor.

In example 24, the subject matter of one of the examples 18-23 can optionally include a number of different phase signals output by the amplification circuit being an even number larger than 3.

In example 25, the subject matter of one of the examples 18-24 can optionally include all inductors of the plurality of inductors comprise substantially the same inductance.

In example 26, the subject matter of one of the examples 18-25 can optionally include a direction of a magnetic field at a region of a maximal magnetic field generated by an inductor of the plurality of inductors being substantially equal for all inductors of the plurality of inductors for a same signal.

In example 27, the subject matter of one of the examples 18-26 can optionally include an inductive coupling between a first pair of inductors differing from an inductive coupling between a second pair of inductors by a first coupling difference, wherein the amplification circuit is configured to provide two phase signals comprising a first phase difference of less than about 180° to the first pair of inductors and two further phase signals comprising the first phase difference to the second pair of inductors, wherein an inductive coupling between a third pair of inductors differs from an inductive coupling between a fourth pair of inductors by a second coupling difference, wherein the amplification circuit is configured to provide two phase signals comprising a second phase difference of about 180° to the third pair of inductors and two further phase signals comprising the second phase difference to the fourth pair of inductors, and wherein the first coupling difference is smaller than or equal to the second coupling difference.

In example 28, the subject matter of example 27 can optionally include a first phase signal of the two phase signals provided to the first pair of inductors and a first phase signal of the two phase signals provided to the second pair of inductors comprising a phase difference of about 180°.

In example 29, the subject matter of example 27 or 28 can optionally include the first phase difference being equal to an integer multiple of about 360° divided by a number of different phase signals output by the amplification circuit.

In example 30, the subject matter of one of the examples 27-29 can optionally include a first phase signal of the two phase signals provided to the third pair of inductors and a first phase signal of the two phase signals provided to the fourth pair of inductors comprising a phase difference of about 180°.

In example 31, the subject matter of one of the examples 27-30 the first coupling difference being less than 20% of the second coupling difference.

In example 32, the subject matter of one of the examples 27-31 can optionally include a distance between the inductors of the first pair of inductors differing from a distance between the inductors of the second pair of inductors by a first distance difference, wherein a distance between the inductors of the third pair of inductors differs from a distance between the inductors of the fourth pair of inductors by a second distance difference, and wherein the first distance difference is smaller than a second distance difference.

In example 33, the subject matter of one of the examples 27-32 can optionally include a distance between the inductors of the first pair of inductors differing from a distance between the inductors of the second pair of inductors by less than 1 mm.

In example 34, the subject matter of one of the examples 27-33 can optionally include each pair of inductors conducting phase signals having a phase difference other than about 180° comprising a lower coupling difference with respect to another pair of inductors conducting phase signals having a phase difference other than about 180° than the second coupling difference.

In example 35, the subject matter of any of the previous examples can optionally include the multi-phase amplifier circuit being configured to generate an amplified output signal based on an input signal.

In example 36, the subject matter of example 35 can optionally include the input signal being an analog signal and the amplified output signal is an analog signal.

In example 37, the subject matter of examples 35 or 36 can optionally include the input signal being an envelope tracking control signal of a radio frequency transmit signal and the amplified output signal is an envelope tracking power supply signal for a power amplifier configured to amplify the radio frequency transmit signal.

In example 38, the subject matter of any of the previous examples can optionally include the amplification circuit and the plurality of inductors being arranged in a common semiconductor package.

Example 39 relates to an apparatus for generating a power supply signal for a power amplifier configured to amplify radio frequency transmit signals, wherein the apparatus comprises a multi-phase amplifier circuit, according any one of the previous examples, wherein the multi-phase amplifier circuit is configured to generate the power supply signal.

Example 40 relates to a transmitter or a transceiver comprising an apparatus according to any one of the preceding examples.

Example 41 relates to a transmitter or a transceiver according to any of the preceding examples.

Example 42 relates to a cell phone comprising a transmitter or a transceiver according to any of the preceding examples.

Example 43 is a method for generating an amplified output signal, the method comprising generating a plurality of phase signals and providing the plurality of phase signals to a plurality of inductors, wherein a first pair of inductors have a first inductive coupling that is different from an inductive coupling of a second pair of inductors by a first coupling difference, wherein a plurality of first phase signals comprising a first phase difference of less than about 180° are provided to the first pair of inductors and a plurality of second phase signals comprising the first phase difference are provided to the second pair of inductors, wherein a third pair of inductors have an inductive coupling that is different from an inductive coupling of a fourth pair of inductors by a second coupling difference, wherein a plurality of third phase signals comprising a second phase difference of about 180° are provided to the third pair of inductors and a plurality of fourth phase signals comprising the second phase difference are provided to the fourth pair of inductors, wherein an absolute value of the first coupling difference is smaller than or equal to an absolute value of the second coupling difference.

In example 44, the subject matter of example 43 can optionally include a first phase signal of the plurality of first phase signals provided to the first pair of inductors and a first phase signal of the plurality of second phase signals provided to the second pair of inductors comprising a phase difference of about 180°.

In example 45, the subject matter of one of the example 43 or 44 can optionally include the first phase difference being equal to an integer multiple of about 360° divided by a number of different generated phase signals.

In example 46, the subject matter of one of the example 43-45 can optionally include a first phase signal of the plurality of third phase signals provided to the third pair of inductors and a first phase signal of the plurality of fourth phase signals provided to the fourth pair of inductors comprise a phase difference of about 180°.

In example 47, the subject matter of one of the examples 43-46 can optionally include the first coupling difference being less than 20% of the second coupling difference.

In example 48, the subject matter of one of the examples 43-47 can optionally include a distance between the inductors of the first pair of inductors differing from a distance between the inductors of the second pair of inductors by a first distance difference, wherein a distance between the inductors of the third pair of inductors differs from a distance between the inductors of the fourth pair of inductors by a second distance difference, and wherein the first distance difference is smaller than a second distance difference.

In example 49, the subject matter of one of the examples 43-48 can optionally include a distance between the inductors of the first pair of inductors differing from a distance between the inductors of the second pair of inductors by less than 1 mm.

In example 50, the subject matter of one of the examples 43-49 can optionally include providing a first phase signal being provided to a first inductor of the plurality of inductors, a second phase signal is provided to a second inductor of the plurality of inductors and a third phase signal is provided to a third inductor of the plurality of inductors, wherein a phase difference between the first phase signal and the second phase signal is about 180° and a phase difference between the first phase signal and the third phase signal is larger than about 180°, and wherein an inductive coupling between the first inductor and the second inductor is smaller than an inductive coupling between the first inductor and the third inductor.

In example 51, the subject matter of example 50 can optionally include a distance between the first inductor and the second inductor being larger than a distance between the first inductor and the third inductor.

In example 52, the subject matter of one of the examples 43-51 can optionally include each pair of inductors conducting phase signals having a phase difference other than about 180° comprising a lower coupling difference with respect to another pair of inductors conducting phase signals having a phase difference other than about 180° than the second coupling difference.

Example 53 is a method for generating an amplified output signal, the method comprising generating a plurality of phase signals and providing the plurality of phase signals to a plurality of inductors, wherein a first phase signal is provided to a first inductor of the plurality of inductors, a second phase signal is provided to a second inductor of the plurality of inductors and a third phase signal is provided to a third inductor of the plurality of inductors, wherein a phase difference between the first phase signal and the second phase signal is about 180° and a phase difference between the first phase signal and the third phase signal is larger than about 180°, wherein an inductive coupling between the first inductor and the second inductor is smaller than an inductive coupling between the first inductor and the third inductor.

In example 54, the subject matter of example 53 can optionally include a distance between the first inductor and the second inductor being larger than a distance between the first inductor and the third inductor.

In example 55, the subject matter of one of the examples 53-54 can optionally include an inductive coupling between a first pair of inductors differing from an inductive coupling between a second pair of inductors by a first coupling difference, wherein two phase signals comprising a first phase difference of less than about 180° are provided to the first pair of inductors and two further phase signals comprising the first phase difference are provided to the second pair of inductors, wherein an inductive coupling between a third pair of inductors differs from an inductive coupling between a fourth pair of inductors by a second coupling difference, wherein two phase signals comprising a second phase difference of about 180° are provided to the third pair of inductors and two further phase signals comprising the second phase difference are provided to the fourth pair of inductors, wherein an absolute value of the first coupling difference is smaller than or equal to an absolute value of the second coupling difference.

In example 56, the subject matter of example 55 can optionally include the first phase difference being equal to an integer multiple of about 360° divided by a number of different generated phase signals.

In example 57, the subject matter of one of the example 53-56 can optionally include a first phase signal of the two phase signals provided to the third pair of inductors and a first phase signal of the two phase signals provided to the fourth pair of inductors comprising a phase difference of about 180°.

In example 58, the subject matter of one of the example 53-57 can optionally include the absolute value of the first coupling difference being less than 20% of the absolute value of the second coupling difference.

In example 59, the subject matter of one of the examples 53-58 can optionally include a distance between the inductors of the first pair of inductors differing from a distance between the inductors of the second pair of inductors by a first distance difference, wherein a distance between the inductors of the third pair of inductors differs from a distance between the inductors of the fourth pair of inductors by a second distance difference, and wherein the first distance difference is smaller than a second distance difference.

In example 60, the subject matter of one of the examples 53-59 can optionally include a distance between the inductors of the first pair of inductors differing from a distance between the inductors of the second pair of inductors by less than 1 mm.

In example 61, the subject matter of one of the examples 53-60 can optionally include each pair of inductors conducting phase signals having a phase difference other than about 180° comprising a lower absolute value of a coupling difference with respect to another pair of inductors conducting phase signals having a phase difference other than about 180° than the absolute value of the second coupling difference.

In example 62, the subject matter of one of the examples 53-61 can optionally include the amplified output signal being generated based on an input signal.

In example 63, the subject matter of example 62 can optionally include the input signal being an analog signal and the amplified output signal being an analog signal.

In example 64, the subject matter of one of the examples 53-63 can optionally include the input signal being an envelope tracking control signal of a radio frequency transmit signal and the amplified output signal being an envelope tracking power supply signal for a power amplifier configured to amplify the radio frequency transmit signal.

Example 65 relates to a machine readable storage medium including program code, when executed, to cause a machine to perform the subject matter of examples 53-64.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for something". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A multi-phase amplifier circuit comprising an amplification circuit configured to generate a plurality of phase signals for a plurality of inductors, comprising:
   a first pair of inductors having a first inductive coupling that is different from an inductive coupling of a second pair of inductors by a first coupling difference;
   the amplification circuit configured to provide a plurality of first phase signals comprising a first phase difference of less than about 180° to the first pair of inductors and a plurality of second phase signals comprising the first phase difference to the second pair of inductors; and
   a third pair of inductors having an inductive coupling that is different from an inductive coupling of a fourth pair of inductors by a second coupling difference,
   wherein the amplification circuit is configured to provide a plurality of third phase signals comprising a second phase difference of about 180° to the third pair of inductors and a plurality of fourth phase signals comprising the second phase difference to the fourth pair of inductors,
   wherein an absolute value of the first coupling difference is smaller than or equal to an absolute value of the second coupling difference.

2. The multi-phase amplifier circuit according to claim 1, wherein a first phase signal of the plurality of first phase signals provided to the first pair of inductors and a first phase signal of the plurality of second phase signals provided to the second pair of inductors comprise a phase difference of about 180°.

3. The multi-phase amplifier circuit according to claim 1, wherein the first phase difference is equal to an integer multiple of about 360° divided by a number of different phase signals output by the amplification circuit.

4. The multi-phase amplifier circuit according to claim 1, wherein a first phase signal of the plurality of third phase signals provided to the third pair of inductors and a first phase signal of the plurality of fourth phase signals provided to the fourth pair of inductors comprise a phase difference of about 180°.

5. The multi-phase amplifier circuit according to claim 1, further comprising a number of phase signal paths connected to the amplification circuit equal to a number of different phase signals output by the amplification circuit, wherein each phase signal path comprises an inductor of the plurality of inductors.

6. The multi-phase amplifier circuit according to claim 5, wherein the phase signal paths are connected to a summing node, wherein an amplified output signal of the multi-phase amplifier circuit is generated based on a sum of the plurality of phase signals at the summing node.

7. The multi-phase amplifier circuit according to claim 6, wherein at least one filter capacitor is connected to an output signal path located between the summing node and an output of the multi-phase amplifier circuit, wherein the plurality of inductors and the at least one filter capacitors form a low-pass filter.

8. The multi-phase amplifier circuit according to claim 7, further comprising a filter bandwidth controller configured to adjust a capacitance of the at least one filter capacitor.

9. The multi-phase amplifier circuit according to claim 1, wherein the absolute value of the first coupling difference is less than about 20% of the absolute value of the second coupling difference.

10. The multi-phase amplifier circuit according to claim 1, wherein a number of different phase signals output by the amplification circuit is an even number larger than 3.

11. The multi-phase amplifier circuit according to claim 1, wherein each inductor of the plurality of inductors comprises substantially same inductance.

12. The multi-phase amplifier circuit according to claim 1, wherein a direction of a magnetic field at a region of a maximal magnetic field generated by an inductor of the plurality of inductors is substantially equal for all inductors of the plurality of inductors for a same signal.

13. A multi-phase amplifier circuit comprising an amplification circuit configured to generate a plurality of phase signals and to provide the plurality of phase signals to a plurality of inductors,
   wherein the amplification circuit is configured to provide a first phase signal to a first inductor of the plurality of inductors, a second phase signal to a second inductor of the plurality of inductors and a third phase signal to a third inductor of the plurality of inductors, wherein a phase difference between the first phase signal and the second phase signal is about 180° and a phase difference between the first phase signal and the third phase signal is larger than about 180°, wherein an inductive coupling between the first inductor and the second inductor is smaller than an inductive coupling between the first inductor and the third inductor.

14. The multi-phase amplifier circuit according to claim 13, wherein a distance between the first inductor and the second inductor is larger than a distance between the first inductor and the third inductor.

15. The multi-phase amplifier circuit according to claim 1, wherein the multi-phase amplifier circuit is configured to generate an amplified output signal based on an input signal.

16. The multi-phase amplifier circuit according to claim 15, wherein the input signal is an analog signal and the amplified output signal is an analog signal.

17. The multi-phase amplifier circuit according to claims 15, wherein the input signal is an envelope tracking control signal of a radio frequency transmit signal and the amplified output signal is an envelope tracking power supply signal for a power amplifier configured to amplify the radio frequency transmit signal.

18. The multi-phase amplifier circuit according to claim 1, wherein the amplification circuit and the plurality of inductors are arranged in a common semiconductor package.

19. A method for generating an amplified output signal, the method comprising:
- generating a plurality of phase signals; and
- providing the plurality of phase signals to a plurality of inductors,
- wherein a first pair of inductors have a first inductive coupling that is different from an inductive coupling of a second pair of inductors by a first coupling difference, wherein a plurality of first phase signals comprising a first phase difference of less than about 180° are provided to the first pair of inductors and a plurality of second phase signals comprising the first phase difference are provided to the second pair of inductors,
- wherein a third pair of inductors have an inductive coupling that is different from an inductive coupling of a fourth pair of inductors by a second coupling difference, wherein a plurality of third phase signals comprising a second phase difference of about 180° are provided to the third pair of inductors and a plurality of fourth phase signals comprising the second phase difference are provided to the fourth pair of inductors,
- wherein an absolute value of the first coupling difference is smaller than or equal to an absolute value of the second coupling difference.

20. A method for generating an amplified output signal, the method comprising:
- generating a plurality of phase signals; and
- providing the plurality of phase signals to a plurality of inductors,
- wherein a first phase signal is provided to a first inductor of the plurality of inductors, a second phase signal is provided to a second inductor of the plurality of inductors and a third phase signal is provided to a third inductor of the plurality of inductors, wherein a phase difference between the first phase signal and the second phase signal is about 180° and a phase difference between the first phase signal and the third phase signal is larger than about 180°, wherein an inductive coupling between the first inductor and the second inductor is smaller than an inductive coupling between the first inductor and the third inductor.

* * * * *